United States Patent [19]
Kobayashi et al.

[11] Patent Number: 4,984,198
[45] Date of Patent: Jan. 8, 1991

[54] LIQUID CRYSTAL ELECTROOPTIC MEMORY DEVICE

[75] Inventors: Shunsuke Kobayashi, Tokyo; Hidenori Ikeno, Koganei; Hiroki Maeda, Yokohama; Bai Y. Zhang; Masaaki Yoshida, both of Tokyo, all of Japan

[73] Assignee: Tokyo University of Agriculture and Technology, Tokyo, Japan

[21] Appl. No.: 496,527

[22] Filed: Mar. 20, 1990

[30] Foreign Application Priority Data

Mar. 31, 1989 [JP] Japan ................................. 1-78672

[51] Int. Cl.$^5$ ...................... G11C 11/42; G11C 13/04
[52] U.S. Cl. ................................. 365/108; 365/106; 365/117
[58] Field of Search ................ 365/108, 106, 107, 117

[56] References Cited

U.S. PATENT DOCUMENTS

4,733,370  3/1988  Kitajima ............................ 365/108

OTHER PUBLICATIONS

"Electrooptic Bistability . . . "; Japanese Journal of Applied Physics; vol. 28, No. 1; Jan. 1989; (L116–L118).
"Electrooptic Bistability . . . "; Japanese Journal of Applied Physics; vol. 27, No. 4; Apr. 1988; (L475–L476).
"Submicrosecond Bistable Electro–Optic . . . ", (pp. 899–901), Applied Phys Letters, 1 Jun. 1980.

Primary Examiner—Terrell W. Fears
Attorney, Agent, or Firm—Spencer & Frank

[57] ABSTRACT

The disclosed liquid crystal electrooptic memory device uses a ferroelectric liquid crystal sandwiched by a pair of molecular oriented films attached to opposite surfaces thereof, and a pair of transparent conductive films are attached to the outside surfaces of the molecular oriented films, respectively. An impedance having a constant electrostatic capacitance and a variable resistance is connected to one of the transparent conductive films. Further, an electric pulse source is connected across the transparent conductive films through the impedance. When a pulse from the pulse source is applied to the transparent conductive films, light transmittance of the ferroelectric liquid crystal is set at different levels depending on the resistance of the impedance. Thus, the resistance of the impedance is memorized in the form of the light transmittance of the ferroelectric liquid crystal. The impedance can be in the form of a photoconductive film attached to the molecular oriented film.

11 Claims, 12 Drawing Sheets

FIG_1

FIG_2
PRIOR ART

FIG_3A

FIG_3B
PRIOR ART

FIG_4

FIG_5

FIG_6A

FIG_6B

FIG_7A

FIG_7B

FIG_8

FIG. 9

LIQUID CRYSTAL ELECTROOPTIC MEMORY DEVICE

BACKGROUND OF THE INVENTION

1. Field of the Invention

This invention relates to a liquid crystal electrooptic memory device using ferroelectric liquid crystal.

The liquid crystal electrooptic memory device of the invention can be used in a liquid crystal display, an optical computer, an optical printer, and the like. Other field of possible application include a liquid crystal information display panel, a liquid crystal printer, an electrophotographic copying machine, an optical information processing unit, an optical neuro-computer, an optical disk etc.

2. Related Art Statement

As compared with regular nematic devices, ferroelectric liquid crystal electrooptical memory device (FE-LCD) has outstanding features (N. Clark and S. Lagerwall: Applied Physics, Lett. 36 (1980) 899.); namely, (1) memory characteristics, especially bistability, and
(2) high-speed response in the order to 10–100 $\mu$S.

However, production of test models of such memory device encountered with the following short-comings and difficulties that hampered practical use of such memory device.

(a) For a memory device having an area of several tens to several hundreds of square centimeters, it is difficult to achieve high bistability in a uniform manner throughout the entire area.

(b) Molecular orientation tends to be imperfect, and the display sometimes becomes defective.

(c) Gray-scale display, which is an important requirement for application to almost all the information display means, is impossible.

The above shortcomings and difficulties are common problems for all the researchers and development engineers in this field throughout the world. In addition, there is a need for the following function.

(d) There is no practical method available for storing planar optical information, e.g., picture information, in liquid crystals by simply directing such optical information onto the liquid crystals.

SUMMARY OF THE INVENTION

Therefore, an object of the present invention is to provide a liquid crystal electrooptic memory device which can produce gray-scale images in a reliable manner so as to meet the requirement of information display means and the like.

Another object of the invention is to provide an electrooptic memory device made of ferroelectric liquid crystal which can produce good latent image in response to input light information, the latent image being able to made visible through a simple means.

An embodiment of the liquid crystal electrooptic memory device according to the present invention comprises a ferroelectric liquid crystal sandwiched by a pair of molecular oriented films attached to opposite surfaces thereof, the molecular oriented films having a certain electric conductivity; a pair of transparent conductive films attached to the outside surfaces of the molecular oriented films on opposite surfaces of the ferroelectric liquid crystal, respectively; an impedance connected to one of the transparent conductive films, the impedance having a constant electrostatic capacitance and a variable resistance; and an electric pulse source connected across the transparent conductive films through said impedance. In this embodiment of the memory device with the impedance, the ferroelectric liquid crystal is set at different levels in response to application of a pulse signal from the electric pulse source to said transparent conductive films depending on the resistance of the impedance, and information represented by the resistance of the impedance is stored in the form of the light transmittance of the ferroelectric liquid crystal.

The impedance to be connected to the transparent conductive film of the memory device of the invention can be a parallel circuit having a static capacitor and a variable resistor Another embodiment of the liquid crystal electrooptic memory device according to the invention comprises a ferroelectric liquid crystal sandwiched by a pair of molecular oriented films attached to opposite surfaces thereof, the molecular oriented films having a certain electric conductivity; at least one photoconductive film attached to outer surface of the molecular oriented film at one side of the ferroelectric liquid crystal, the photoconductive film having a certain electrostatic capacitance and such a resistance which varies in response to incident light thereto; a pair of transparent conductive films sandwiching said molecular oriented films on opposite surfaces of the ferroelectric liquid crystal with said at least one photoconductive film held between the photoconductive film and the transparent conductive film; and an electric pulse source connected across the transparent conductive films. In this embodiment of the invention using the photoconductive film, the light transmittance of the ferroelectric liquid crystal is set at different levels in response to application of a pulse signal from the electric pulse source to said transparent conductive films depending on the resistance of the photoconductive film, and the information represented by the resistance of the photoconductive film is stored in the form of a latent image formed of the light transmittance levels of the electric liquid crystal in response to application of the pulse signal thereto.

It is noted here that there are two problems to be solved before getting latent image memory in ferroelectric liquid crystal in response to incident light thereto; namely, high bistability of ferroelectric liquid crystal, and gray-scale image, namely contrast in the latent image memory for representing the intensity variation of the input light. The inventors have solved the above two problems through various studies and experiments, and have succeeded in providing an epoch-making liquid crystal electrooptic memory device which can store optical information in the form of good latent image and can easily reproduce the stored information.

BRIEF DESCRIPTION OF THE DRAWINGS

For a better understanding of the invention, reference is made to the accompanying drawings, in which.

Throughout different views of the drawings, 1 is a ferroelectric liquid crystal, 2 is a molecular oriented film, 3 is a light reflection film, 4 is a photoconductive film, 5 is a transparent conductive film (a transparent electrode), 6 is a glass substrate, 7 is a polarizing plate, 8 is an electric pulse source, 10, 20, 30 are liquid crystal electrooptic memory devices, 31 is a real image, 33 is a latent image memory, 39 is a gray-scale image, 40 is a ferroelectric liquid crystal cell, LW is writing light, and LR is reading light.

DESCRIPTION OF THE PREFERRED EMBODIMENT

The invention will be described now by referring to the illustrated embodiments.

Figure 2:
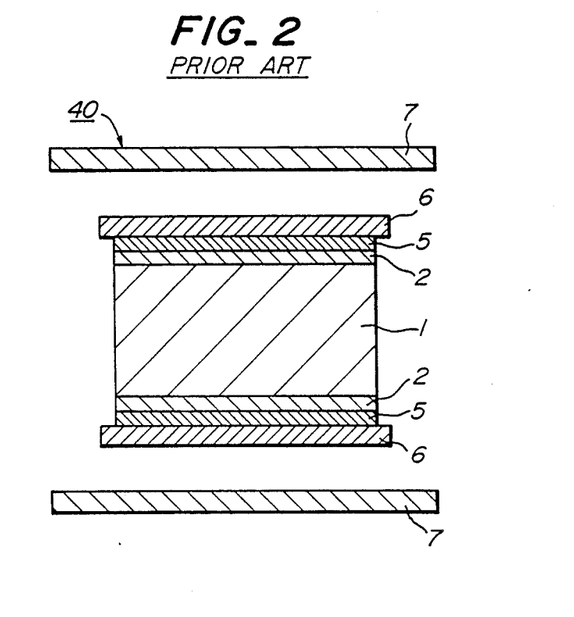
FIG. 2 is a schematic sectional view of a liquid crystal electrooptic memory device of prior art which has no impedance element connected thereto.

FIG. 2 shows a sectional view of a liquid crystal cell 40 of prior art. The illustrated liquid crystal cell 40 uses a ferroelectric liquid crystal 1 which is made for instance by Merck & Co., Inc., Chisso Co., Ltd., or Dainippon Ink & Chemicals, Inc., and available on the market. The ferroelectric liquid crystal 1 is sandwiched by three-layered coverings, each covering consisting of an innermost layer of a molecular oriented film 2, a transparent conductive film 5, and an outermost layer of a glass substrate 6. The molecular oriented film 2 is, for instance, a 500 Å (50 nm) thick polyimide film, and its surface is mechanically rubbed so as to orient molecules of the electric liquid crystal 1.

The inventors have succeeded in achieving perfect bistability by using the following three factors.

(a) To use a Langmuir-Blodgett (LB) polyimide film as the molecular oriented film 2

(b) To add a charge-moving complex, such as TMTTFODTCNQ (tetra-methyl tetra-thiafurbaren-octadecyl-tetra-cyano-quinodimethane), in the oriented polyimide film 2

(c) To add ion in the oriented high-molecular film

Such bistability obtained by the above three factors was reported in the following two papers:

(1) H.Ikeno, A.Ohsaki, M.Nitta, N.Ozaki, Y.Yokoyama, K.Nakaya, and S.Kobayashi; Jpn J. Appl. Phys. Lett. 27. (1988) 475

(2) K.Nakayama, Bai, Ying Zhang, M.Yoshida, I.Isa, S.Shindoh, and S.Kobayashi; Jpn J. Appl. Phys. Lett. 28. (1989) L116.

Figure 3A:
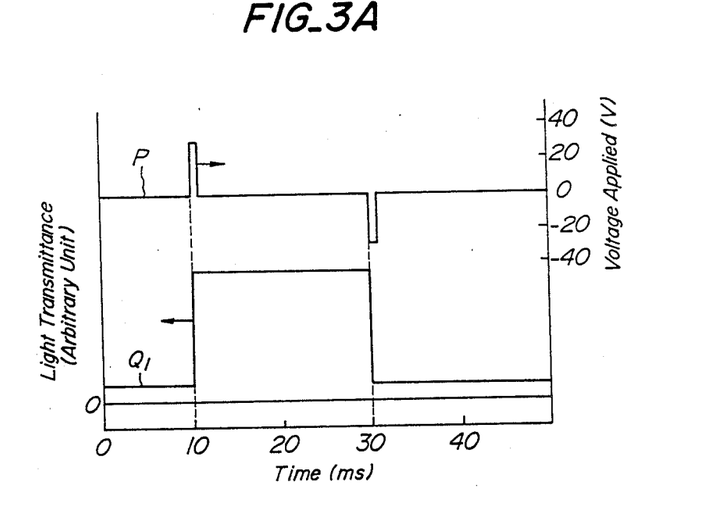
FIG. 3A is a graph of the electrooptic characteristics of a ferroelectric liquid crystal electrooptic memory cell which uses an oriented polyimide Langmuir-Blodgett (LB) film (i.e., an oriented polyimide film added with a charge-moving complex)
Figure 3B:
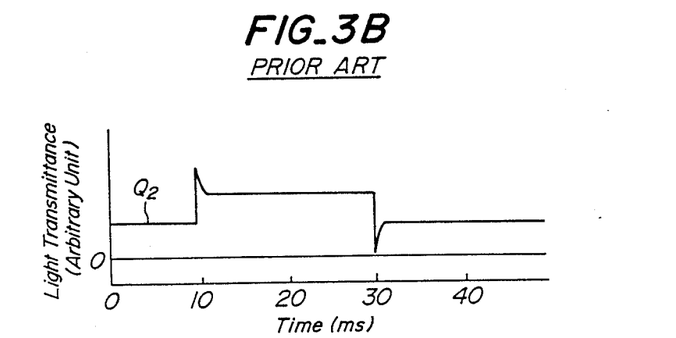
FIG. 3B is a graph of the electrooptic characteristics of a ferroelectric liquid crystal electrooptic memory device using oriented polyimide film of prior art.

The effects of the above-mentioned three factors (a) through (c) on the electrooptic characteristics of the ferroelectric liquid crystal 1, i.e., the applied pulse voltage versus light transmittance characteristics, were tested, FIG. 3A shows the test result for the liquid crystal cell 40 with the Langmuir-Blodgett polyimide films 2, while FIG. 3B shows the test result for the liquid crystal cell 40 with conventional 500 nm thick rubbed polyimide films 2. The upper curve P of FIG. 3A represents the waveform of the applied pulse voltage, and the lower curves Q1 and Q2 of FIGS. 3A and 3B show the electrooptic response characteristics. In response to a positive pulse with a pulse amplitude of +30 V and a pulse width of 1 mS, the light transmittance of the liquid crystal cell 40 is raised to a high or bright level. Even after the pulse voltage is removed, the high level of the light transmittance is retained. The thus retained high light transmittance means the storing or memory action.

In the case of the conventional liquid crystal cell 40 with rubbed polyimide film 2, the high light transmittance is decayed with elapse of time as shown in FIG. 3B. On the other hand, the liquid crystal cell 40 with the Langmuir-Blodgett polyimide films 2 is free from such decay of light transmittance as shown in FIG. 3A.

When an electric pulse of the opposite polarity, e.g., a pulse of −30 V, is applied, the light transmittance of the liquid crystal cell 40 is switched to a low or dark level and retained there. The retaining of the two different levels of light transmittance corresponding to the electric pulses of opposite polarities is referred to as the bistability. With the conventional polyimide films 2, the contrast between the two memory levels decays gradually with the elapse of time, as shown in FIG. 3B. Thus, the bistability of the conventional polyimide film is low. On the other hand, the inventors have found that the Langmuir-Blodgett polyimide film 2 (i.e., a polyimide film added with a charge-moving complex or an oriented high-molecular film added with ions) has a high bistability.

Thus, the problem of bistability has been solved by using the specific molecular oriented films. Based on this solution, the inventors has succeeded, for the first time in industry, in producing a gray-scale image in the liquid crystal image device, i.e., an image with different levels of intensity or different degrees of darkness.

The inventors have found two facts. At first, as described above, the bistability is ensured by using the specific molecular oriented films 2 (see FIG. 2); namely, the above-mentioned Langmuir-Blodgett polyimide film, or polyimide films added with a charge-moving complex such as TMTTF-ODTCQN (the latter films must be rubbed).

Figure 1:
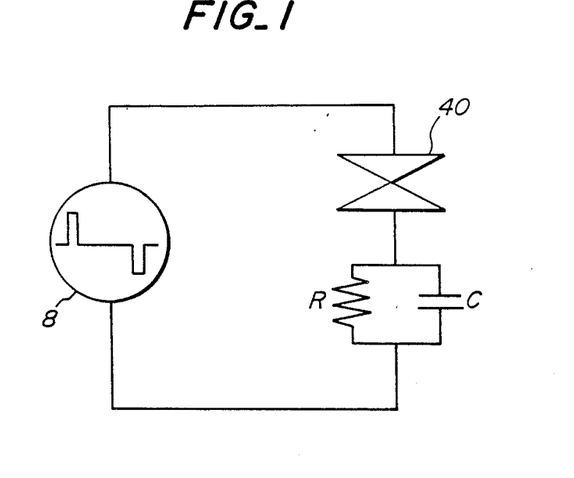
FIG. 1 is a circuit diagram of a liquid crystal electrooptic memory device according to the invention, which uses a liquid crystal cell that is connected to an impedance element at the outside thereof.
Figure 4:
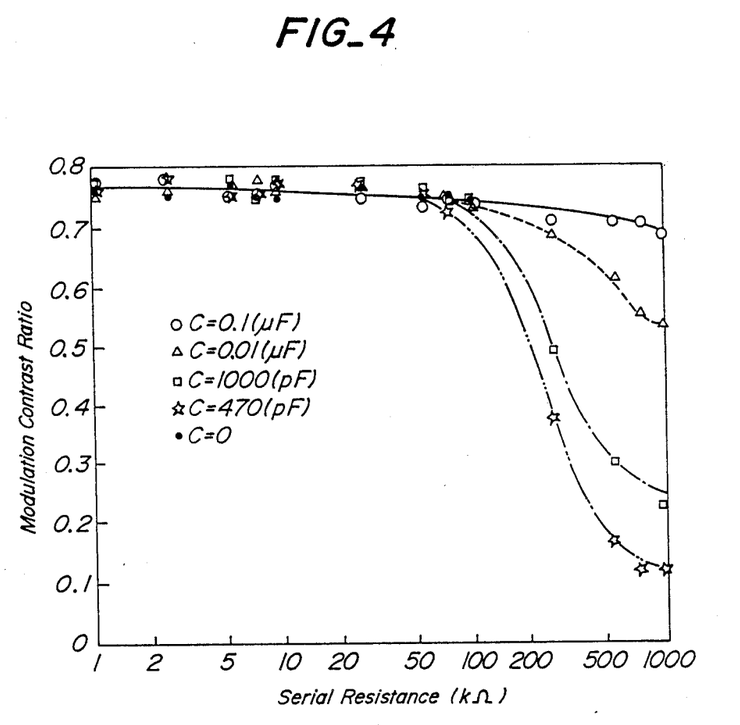
FIG. 4 is a diagram showing the relationship between modulation contrast ratio of the liquid crystal cell of FIG. 1 and the resistance value of the impedance element thereof.

Secondly, a gray-scale image can be produced in the liquid crystal cell 40 by connecting a variable impedance to it and regulating the value of the impedance. In particular, when a capacitor C shunted by a resistor R was connected between the liquid crystal cell 40 and an electric pulse source 8 as shown in FIG. 1, the light transmittance of the liquid crystal cell 40 could be regulated by controlling the value of the CR impedance as shown in FIG. 4. The abscissa of the graph of FIG. 4 represents modulation contrast ratio MCR which is defined by $$MCR = (T-1)(T+1)$$

T being the light transmittance of the liquid crystal 1. The MCR represents the ratio between the above transmittance at the bright level and that at the dark level. The ordinate of the graph of FIG. 4 represents the resistance of the resistor R of FIG. 1. Parameter for the different curves of FIG. 4 is the capacitance of the capacitor C of FIG. 1.

As can be seen from FIG. 4, the bright/dark contrast of brightness or light transmittance can be regulated at will over a wide range by controlling the resistance of the resistor R in a range of larger than 5 kΩ. For instance, if the capacitor C is set at 1,000 pF, the modulation contrast ratio MCR can be regulated between about 0.25 and about 0.75 by controlling the resistance of the resistor R in a range of 50–1,000 kΩ.

It is important here that polyimide films added with a charge-moving complex (up to 50 kΩ/cm²) or LB polyimide films (2–30 kΩ/cm²) are used in the liquid crystal cell 40. Thereby, the electric resistivity of the molecular oriented polyimide film can be kept in a proper range, i.e., less than 70 kΩ/cm². Oriented high-molecular films of the prior art have a rather high resistivity, for instance about 1,000 kΩ/cm². With such a high resistivity of the molecular oriented film, the net value of the serial resistance of FIG. 4 becomes large, and the modulation contrast ratio MCR becomes less than about 0.6. Thus, with such high resistivity, the memory stability becomes low and it is theoretically difficult to produce a satisfactory gray-scale image.

On the other hand, the present invention uses the above-mentioned special molecular oriented films which have a low resistivity, so that the molecular oriented films have a suitable conductivity for ensuring a high modulation contrast ratio MCR. Thus, if a suitable impedance is connected to the low-resistivity molecular oriented film, the modulation contrast ratio MCR can be regulated over a wide range by controlling the impedance, and practical and useful gray-scale image can be produced.

Resistivity of ion-added high-molecular oriented films can be made 5–70 kΩ/cm². As molecular oriented films made of high-molecular compounds other than polyimide, the LB oriented films or oriented films added with a charge-moving complex may be used.

Instead of the RC impedance outside the liquid crystal cell 40 as shown in FIG. 1, the inventors have developed a liquid crystal memory device having a photoconductive film built as an integral part thereof, so that the photoconductive film acts as an impedance control layer. More particularly, the photoconductive film has a constant capacitance and a variable resistance, and if an input light information incident to the memory device has a certain pattern of brightness distribution, a corresponding resistance pattern is formed in the photoconductive film, so that the modulation contrast ratio MCR of the liquid crystal is modified depending on the resistance pattern of the photoconductive film as in the case of FIG. 4. Thus, the modulation contrast ratio MCR of the liquid crystal varies depending on the brightness variation of the incident light, and a patterned memory in the form of a latent image representing the input light information pattern can be produced. Different portions of the latent image have stability becomes low and it is theoretically difficult to produce a satisfactory gray-scale image.

On the other hand, the present invention uses the above-mentioned special molecular oriented films which have a low resistivity, so that the molecular oriented films have a suitable conductivity for ensuring a high modulation contrast ratio MCR. Thus, if a suitable impedance is connected to the low-resistivity molecular oriented film, the modulation contrast ratio MCR can be regulated over a wide range by controlling the impedance, and practical and useful gray-scale image can be produced.

Resistivity of ion-added high-molecular oriented films can be made 5–70 kΩ/cm². As molecular oriented films made of high-molecular compounds other than polyimide, the LB oriented films or oriented films added with a charge-moving complex may be used.

Instead of the RC impedance outside the liquid crystal cell 40 as shown in FIG. 1, the inventors have developed a liquid crystal memory device having a photoconductive film built as an integral part thereof, so that the photoconductive film acts as an impedance control layer. More particularly, the photoconductive film has a constant capacitance and a variable resistance, and if an input light information incident to the memory device has a certain pattern of brightness distribution, a corresponding resistance pattern is formed in the photoconductive film, so that the modulation contrast ratio MCR of the liquid crystal is modified depending on the resistance pattern of the photoconductive film as in the case of FIG. 4. Thus, the modulation contrast ratio MCR of the liquid crystal varies depending on the brightness variation of the incident light, and a patterned memory in the form of a latent image representing the input light information pattern can be produced. Different portions of the latent image have such modulation contrast ratios MCR's which depend on brightness or light intensity variation of the corresponding portions of the input light information.

To store the input light information as the latent image in the liquid crystal, an electric signal voltage must be applied to the liquid crystal in synchronism with the application of the input light information thereof. In other words, if the application of a patterned input light information is not in synchronism with the electric signal voltage, no latent image of the corresponding pattern is produced in the liquid crystal.

Figure 5:
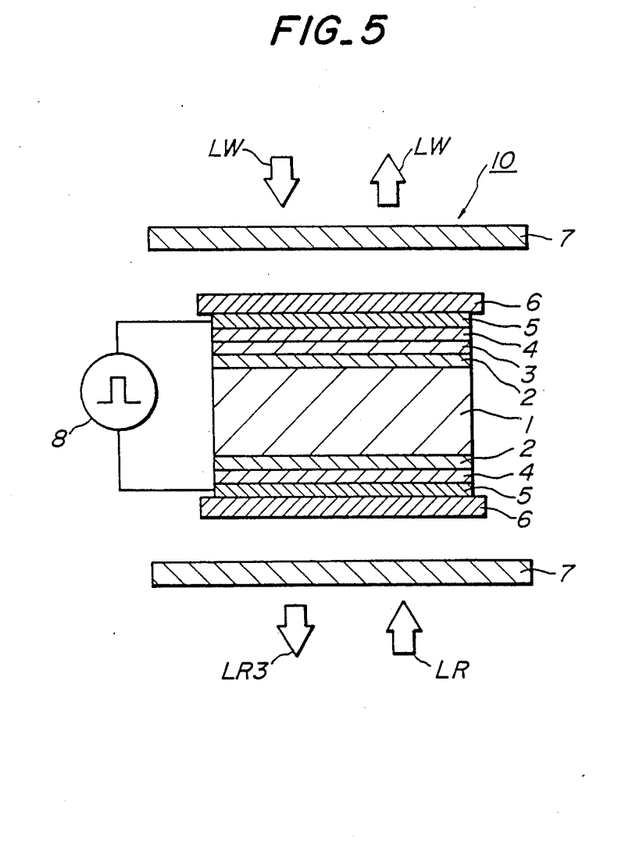
FIG. 5 is a schematic sectional view of a liquid crystal electrooptic memory device of the invention.
Figure 6A:
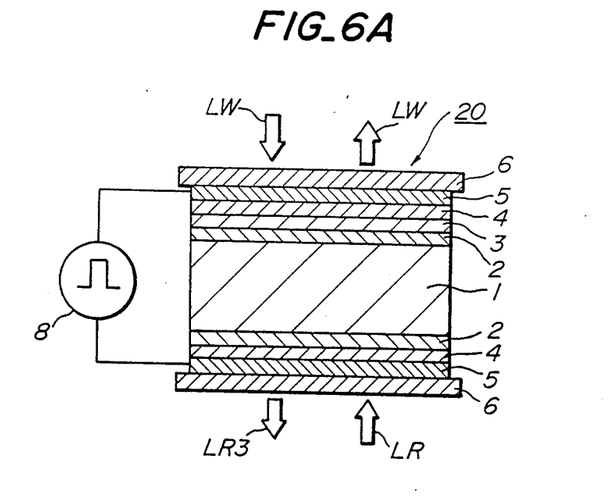
FIG. 6A is a schematic sectional view of a liquid crystal electrooptic memory device without any polarizing plate.
Figure 6B:
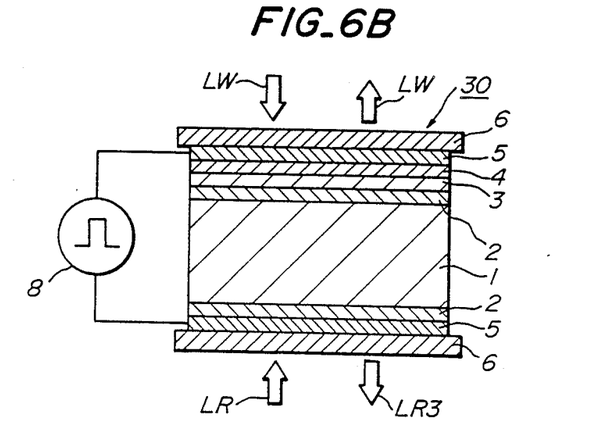
FIG. 6B is a similar view to FIG. 6B except that the memory device is with only one photoconductive film provided at one side of the liquid crystal thereof.

FIGS. 5, 6A, and 6B show different liquid crystal ferroelectric memory devices 10, 20, and 30 of the invention with built-in photoconductive films, respectively.

In the memory device 10 of FIG. 5, a light reflective film 3 is overlaid on one of the two molecular oriented films 2 sandwiching the ferroelectric liquid crystal 1. In this embodiment, the light reflective film 3 is provided on the input side of the liquid crystal 1 where the writing light LW is applied, and the light reflective film 3 is made of a dielectric or a metal. A pair of photoconductive films 4 and a pair of transparent conductive films 5 are successively overlaid on the outer surfaces of the light reflective film 3 and the molecular oriented film 2, respectively. The outer surfaces of the transparent conductive film 5 are secured to the corresponding glass substrates 6, respectively. Polarizing plates 7 are disposed on the writing side and the reading side of the ferroelectric liquid crystal 1, respectively. The output terminals of a pulse signal source 8 are connected to the pair of transparent conductive films 5, respectively, so as to apply its output signal voltage across the films 5.

The memory device 20 of FIG. 6A is simplified from the memory device 10 of FIG. 5 by eliminating the pair of polarizing plates 7. However, one polarizing plate 7 may be provided on either writing side (upper side of FIG. 6A) or the reading side (lower side of FIG. 6A) of the memory device 20. Such polarizing plate 7 is used only for electrooptic reading of the latent image memory stored in the ferroelectric liquid crystal 1.

Further simplification is made in the memory device 30 of FIG. 6B by eliminating one photoconductive film 4 from the reading side (lower side) of the memory device 20 of FIG. 6A. In fact, the light reflective film 3 may be completely eliminated, and the glass substrates 6 may be dispensed with by using hard material in the transparent conductive films 5 so as to let the transparent conductive films 5 function as substrates.

The molecular oriented film 2 can be an oriented high-molecular film with a suitable electric conductivity, such as a polyimide film. Preferably, it is a Langmuir-Blodgett polyimide film or a polyimide film added with a charge-moving complex. It is to provide initial orientation to the ferroelectric liquid crystal 1, and it is transparent.

The photoconductive film 4 may be a film of photoconductive substance such as amorphous silicon. It is also possible to form the photoconductive film 4 by a two-dimensional array of phototransistors or a two-dimensional array of photodiodes.

The process for writing a latent image pattern as a memory in the ferroelectric liquid crystal 1 will be described now.

Figure 7A:
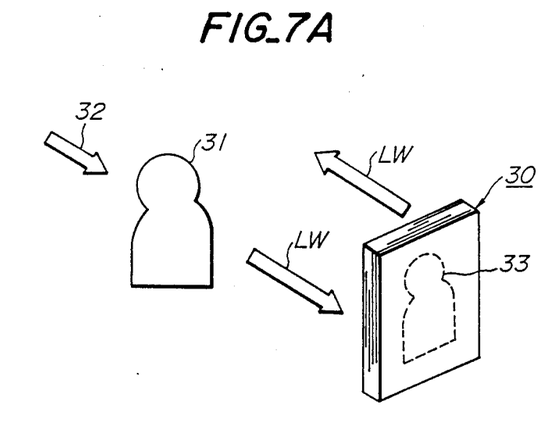
FIG. 7A is an explanatory diagram showing the manner in which a latent image is formed or written in the memory device.

Referring to FIG. 7, a real image 31 is placed in front of, for instance, the memory device 30 of FIG. 6B. Light 32 illuminates the real image 31 and becomes writing light LW. When the writing light LW becomes incident to the memory device 30 from above, as shown in FIG. 6B, it penetrates through the glass substrate 6, the transparent conductive film 5, and the photoconductive film 4, and then it is reflected by the light reflective film 3. The reflected writing light LW proceeds reversely, namely toward the outside of the memory device 30 through the photoconductive film 4, transparent conductive film 5, and the glass substrate 6. In synchronism with the incidence of the writing light LW, a pulse voltage of suitable magnitude from the pulse signal source 8 is applied across the pair of transparent conductive films 5.

At this moment, the function of the photoconductive film 4 is very important. At such portion of the photoconductive film 4 where strong light becomes incident, the electric resistance of the photoconductive film 4 becomes smaller, while where incident light is weak, the electric resistance remains large. Thus, depending on the distribution of the intensity of the incident writing light LW, namely depending on the distribution of the brightness of the real image 31, a resistance pattern is formed in the photoconductive film 4. Upon application of the pulse voltage in synchronism with the formation of resistance pattern, a patterned variation of light transmittance is generated in the ferroelectric liquid crystal 1 depending on the resistance pattern on the photoconductive film 4, as can be seen from the characteristics curves of FIG. 3A and FIG. 4. Thus, a latent image 33 corresponding to the variation pattern of brightness of the writing light LW and that of the real image 31 can be generated in the ferroelectric liquid crystal 1.

To erase the latent image 33, it is sufficient to bring the memory device 30 to a dark space and to apply the electric pulse voltage to the memory device 30 in the dark environment. Similar erasing can be effected by simultaneously applying light of homogeneous intensity and the electric pulse voltage to the memory device 30.

Once the latent image 33 is formed in the ferroelectric liquid crystal 1, exposure of the memory device 30 to light alone does not affect the latent image 33. The latent image 33 is kept intact until the electric pulse voltage is applied in the above-mentioned manner.

Figure 8:
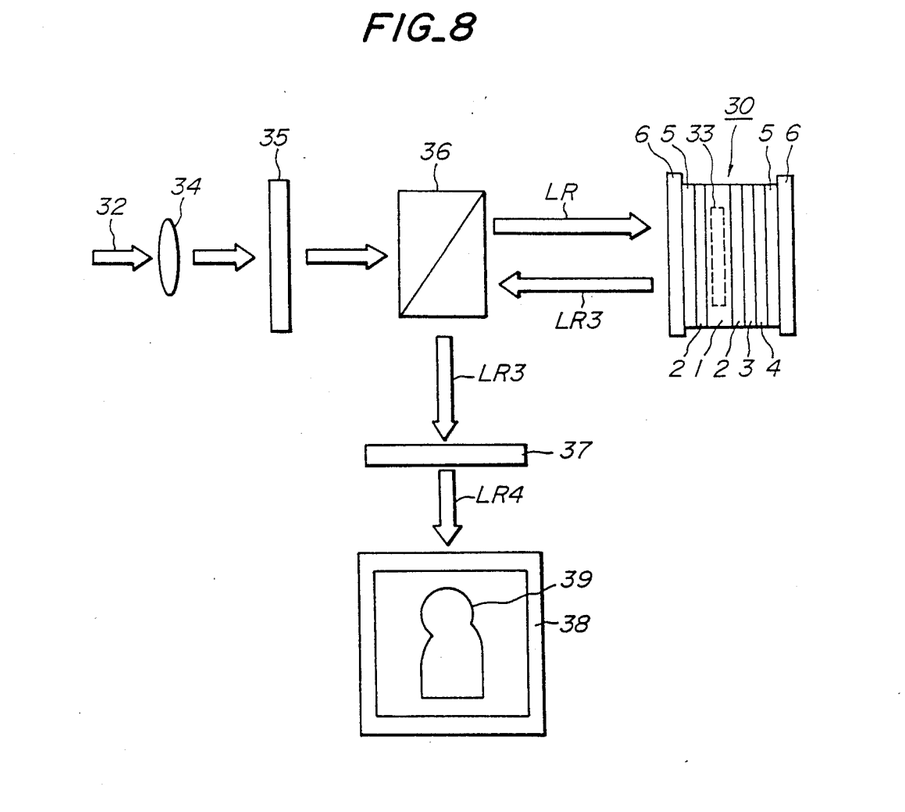
FIG. 8 is a diagrammatic illustration of a process for reproducing the latent image as a visible image.

Optical viewing or reproduction of the latent image 33 will be described now by referring to the explanatory diagram of FIG. 8.

Figure 7B:
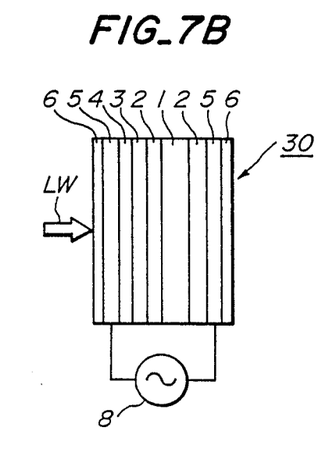
FIG. 7B is a side view of the memory device in which the latent image is written.

Homogeneous light 32 is passed through a lens system 34 and a polarizing plate 35, so as to obtain a parallel light which is polarized by a certain angle. The parallel light passes through a light separator 36 and becomes read light LR which is incident to the read side of the memory device 30. The read side is opposite to the write side where the writing light LW can be applied as shown in FIG. 7B. The read light LR reaches the light reflective film 3 through the glass substrate 6, the transparent conductive film 5, the two molecular oriented films 2, and the ferroelectric liquid crystal 1, and the it is reflected thereby and returns to the outside of the memory device 30 through the above-mentioned films 6, 5, 2 and the liquid crystal 1. The reflected read light LR3 is again reflected by the light separator 36 so as to proceed through a polarizing plate 37 and becomes a red light LR4 which is incident to a screen 38.

When passing through the ferroelectric liquid crystal 1, the read light LR of course passes through the latent image 33 and the polarized plane of the read light LR is rotated by different degrees depending on the brightness difference in the latent image 33. Thus, in the reflected read light LR3, the polarized plane is turned by different angles, so that the different degrees of the rotation of the polarizing plane in the reflected read light LR3 represent the brightness distribution pattern of the latent image 33. At the polarizing plate 37, the pattern made of different rotation degrees in the reflected read light LR3 is converted into a pattern of light intensity, because the passing amount of the polarized light through the polarizing plate 37 depends on the degree of rotation of the polarized light. Hence, when the reading light LR4 after the polarizing plate 37 is projected onto the screen 38, a visual gray-scale image 39 having the same pattern of brightness variation as that of the latent image 33 is produced on the screen 38. The gray-scale image 39 has the same pattern of brightness variation as those of the real image 31 and the latent image 33.

As can be deduced by analogy from FIG. 4, the portion of the photoconductive film 4 where weak light is incident has a high resistance and causes a low modulation contrast ratio MCR in the ferroelectric liquid crystal 1, while the portion of the photoconductive film 4 where strong light is incident has a low resistance and causes a high modulation contrast ratio MCR in the ferroelectric liquid crystal 1. Hence, a latent image 33 corresponding to the real image 31 can store the gray-scale pattern of brightness variation, and such gray-scale latent image 33 can be reproduced by the system of FIG. 8 together with the brightness variation pattern of the real image 31.

Figure 9:
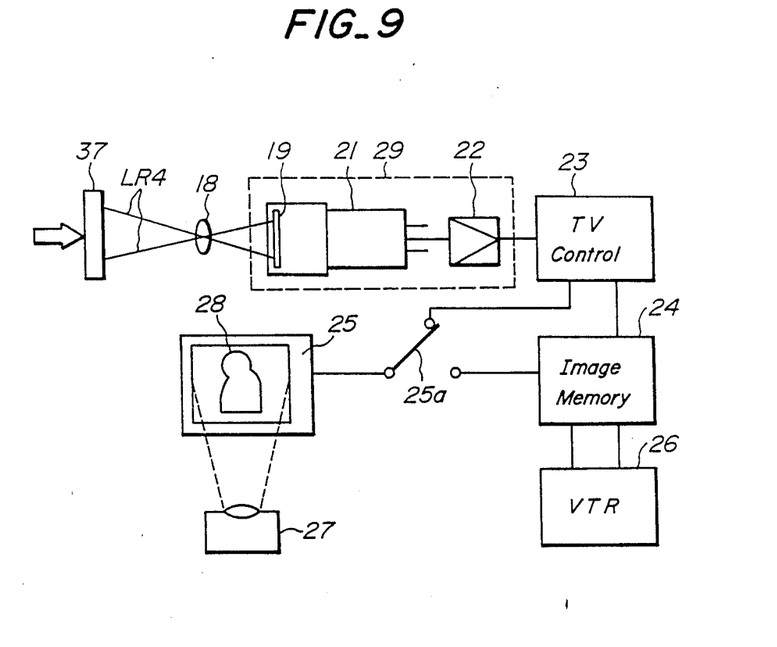
FIG. 9 is a schematic block diagram of a system for converting optical output from the memory device into electric signals and processing the electric signals.

FIG. 9 is a block diagram schematically showing another system for processing the output light from the ferroelectric liquid crystal 1 carrying the latent image 33. In this system, the reflected read light LR4 from the polarizing plate 37 becomes incident to a target 19 of a high-sensitivity television pick-up tube 29 (for instance, a charge coupled device CCD of a solid state pick-up device), and the brightness pattern in the reflected read light LR4 representing the latent image 33 is converted into a charge pattern on the target 19. An image pick-up portion 21 of the pick-up tube 29 scans the charge pattern on the target 19 and converts it into pick-up electric signals. Such electric signals from the image pick-up portion 21 can be displayed on a monitor 25 or stored in a recording mean 26 such as a video-tape recorder.

In the example of FIG. 9, a lens system 18 is disposed between the polarizing plate 37 and the target 19 of the image pick-up portion 21 of the high-sensitivity image pick-up tube 29. The image pick-up tube 29 has an amplifier circuit 22 which may include a preamplifier, a deflector, a high-voltage circuit, a cathode circuit, and the like. The output from the amplifier circuit 22 of the image pick-up tube 29 is applied to a television camera control circuit 23 which may include a video amplifier, a synchronizing circuit, a sequence circuit, a constant voltage power source circuit, and the like. The output from the television camera control circuit 23 is connected to an image memory 24 and to a monitor 25 having a switch 25a. The image memory 24 is also connected to the recording means such as a video-tape recorder of magnetic tape type or magnetic card type. The monitor 25 produces a visible image 28, which can be photographed by a camera 27.

The reflected read light LR4 from the polarizing plate 37 is directed to the target 19 at the front end of the high-sensitivity image pick-up tube 29. The image pick-up tube 29 may use a high-speed image pick-up element, such as CCD target of a high-speed image pick-up portion 21 or a calnicon. The target 19 in the illustrated example is a CCD board on which a high voltage is applied. In response to the incidence of the reflected read light LR4, such CCD board stores electric charge depending on the amount of light received, so as to produce a charge image thereon. When the CCD board with the charge image is scanned by an electron beam of the image pick-up portion 21, an electric current varying in proportion to the electric charge at the scanned parts of the charge image flows in the high-speed image pick-up tube 29. The output from the image pick-up tube 29 is stored in the image memory 24, such as a scanning converter.

The monitor 25 such as a cathode-ray tube is connected to, through a manual switch 15a, either directly to the television camera control circuit 23 or to the image memory 24. When the manual switch 25a is turned to the side of the television camera control circuit 23, i.e., to its auto side, a visual image 28 is produced on the monitor 25, which image can be photographed by the camera 27 if necessary. On the other hand, when the manual switch 25a is turned to the side of the image memory 24, to its manual side, the image stored in the image memory 24 can be monitored. Instead of the illustrated video-tape recorder, a magnetic disk memory means (not shown) may be used as the recording means 26 connected to the memory means 24, so as to store a certain image or images on one magnetic disk which is convenient for recording and reproducing of the image. The output of the video memory 24 may be connected to a computer through a suitable analog-digital converter (not shown), for the purpose of image analysis by the computer. The image information stored in the recording means 26, such as the video-tape recorder or a disk memory (not shown), can be of course reproduced by a VTR player or a video disk player (not shown).

In the memory device 10 of the invention as shown in FIG. 5, the inventors used the photoconductive film 4 made of amorphous silicon, and the dielectric light reflecting film 3 made of silver-titanium (AgTi) film or a gold-evaporated film. The inventors tested the operating principles of such memory device 10 by using He-Ne laser beam as the writing light LW and reading light LR. Thereby, it was confirmed that the modulation contrast ratio MCR at the time of image storing could be controlled in a range of 0.75 to 0.3 by regulating the intensity of the writing light LW in a range of 0–10 mW.

Similarly, the inventors confirmed through tests the same operating principles were valid with the photoconductive film 4 made of a two-dimensional array of MOS phototransistor array or a two-dimensional array of photodiode array. Thus, it is possible to use either a phototransistor linear array or a photodiode linear array in the photoconductive film 4 for the memory device of the invention.

Storage and reproduction of a gray-scale image have been described in the foregoing by using the focusing of an analog image on a photoconductive film in synchronism with application of a driving pulse voltage. The formation of the gray-scale image of the invention can be also used for projection display or hard copy display.

If the light passing through the liquid crystal cell 40 is fed back to the photoconductive film 4, the light transmittance of the cell 40 will be changed thereafter, so as to provide the learning ability. Such learning ability will facilitate the formation of a light neuro-computer.

Superposition of a two-dimensional array of diodes or transistors and the display panel of the invention will open a way for the development of a large capacity liquid crystal display of next generation with the capability of gray-scale image.

As described in detail in the foregoing, with the liquid crystal electrooptic memory device of the invention, the use of molecular oriented films with a comparatively low electric conductivity ensures a high bistability of the memory device. The use of an impedance element with a constant electrostatic capacitance and a variable electric resistance in series with electric pulse signal source facilitates continuous control of the modulation contrast ratio MCR of the memory device from a high level to a low level through regulation of the resistance value of the impedance element. Thus, a gray-scale image can be produced by applying a signal voltage across the transparent conductive films 4 in synchronism with application of an image-carrying light to the ferroelectric liquid crystal cell.

With the invention it is also possible to form a liquid crystal electrooptic memory device by disposing at least one photoconductive film on either side of a ferroelectric liquid crystal, which photoconductive film has a constant static capacitance and a variable electric resistance depending on the intensity of the incident light thereto. When an optical information is applied to the said either side of the ferroelectric liquid crystal, the resistance value of the photoconductive film varies depending on the distribution of the intensity of the incident light, so as to form a distribution pattern of the resistance.

Along with the photoconductive film, transparent conductive films and molecular oriented films with a comparatively low resistance are attached to the opposite side surfaces of the ferroelectric liquid crystal, so that a high bistability is provided to the ferroelectric liquid crystal. If an electric pulse voltage is applied across the transparent conductive films in synchronism with the above input optical information, the orientation of the liquid crystal molecules in the ferroelectric liquid crystal varies depending on the resistance of the photoconductive film, so as to produce a patterned distribution of the molecular orientation corresponding to the above distribution pattern of the resistance of the photoconductive film. With such patterned distribution of the molecular orientation, a patterned distribution of modulation contrast ratio MCR in the ferroelectric liquid crystal, possibly covering a wide MCR range from a high level to a low level, can be produced. Thus, a latent image of the input optical signal can be formed in the ferroelectric liquid crystal in a clear and stable manner.

Therefore, the liquid crystal electrooptic memory device of the invention is very useful in the industry and can be applied to a wide range of fields, for instance, it can be used in a liquid crystal display panel element, an optical computer, a liquid crystal printer, a photoelectric copying machine, an optical data processing equipment, and the like.

Although the invention has been described with a certain degree of particularity, it is understood that the present disclosure has been made only by way of example and that numerous changes in details may be resorted to without departing from the scope of the invention as hereinafter claimed.

What is claimed is:

1. A liquid crystal electrooptic memory device, comprising a ferroelectric liquid crystal sandwiched by a pair of molecular oriented films attached to opposite surfaces thereof, the molecular oriented films having a certain electric conductivity; a pair of transparent conductive films attached to the outside surfaces of the molecular oriented films on opposite surfaces of the ferroelectric liquid crystal, respectively; an impedance connected to one of the transparent conductive films, the impedance having a constant electrostatic capacitance and a variable resistance; and an electric pulse source connected across the transparent conductive films through said impedance, whereby light transmittance of the ferroelectric liquid crystal is set at different levels in response to application of a pulse signal from the electric pulse source to said transparent conductive films depending on the resistance of the impedance, so as to memorize the resistance in form of the light transmittance of the ferroelectric liquid crystal.

2. A liquid crystal electrooptic memory device, comprising a ferroelectric liquid crystal sandwiched by a pair of molecular oriented films attached to opposite surfaces thereof, the molecular oriented films having a certain electric conductivity; at least one photoconductive film attached to outer surface of the molecular oriented film at one side of the ferroelectric liquid crystal, the photoconductive film having a certain electrostatic capacitance and such a resistance which varies in response to incident light thereto; a pair of transparent conductive films sandwiching said molecular oriented films on opposite surfaces of the ferroelectric liquid crystal with said at least one photoconductive film held between the photoconductive film and the transparent conductive film; and an electric pulse source connected across the transparent conductive films, whereby light transmittance of the ferroelectric liquid crystal is set at different levels in response to application of a pulse signal from the electric pulse source to said transparent conductive films depending on the resistance of the photoconductive film, so as to memorize the incident light to the photoconductive film as a latent image formed of the light transmittance levels of the electric liquid crystal.

3. A liquid crystal electrooptic memory device as set forth in claim 2, wherein the memory device further comprises at least one polarizing plate adapted to polarize light from said one side of the ferroelectric liquid crystal, so as to facilitate visual inspection of said latent image formed of the light transmittance levels of the ferroelectric liquid crystal by polarized light through the polarizing plate.

4. A liquid crystal electrooptic memory device as set forth in claim 1, wherein a pair of transparent glass substrates are attached to outer surfaces of said transparent conductive films, respectively.

5. A liquid crystal electrooptic memory device as set forth in claim 1, wherein one polarizing plate is attached to said one side or each side of the ferroelectric liquid crystal.

6. A liquid crystal electrooptic memory device as set forth in claim 2, wherein one polarizing plate is provided to direct polarized light into the ferroelectric liquid crystal carrying the latent image and another polarizing plate is provided to visualize the latent image from light which is transmitted through the ferroelectric liquid crystal.

7. A liquid crystal electrooptic memory device as set forth in claim 6, wherein one light reflective film is provided between the molecular oriented film and the photoconductive film on said one side of the ferroelectric liquid crystal and one polarizing plate is provided at the opposite side of the ferroelectric liquid crystal, whereby polarized light from said opposite side is transmitted through the latent image of the ferroelectric liquid crystal and reflected by the light reflective film and retransmitted through the latent image so as to facilitate visualization of the latent image by polarization of the thus retransmitted light by said polarizing plate.

8. A liquid crystal electrooptic memory device as set forth in claim 6 wherein the memory device further comprises a projecting means adapted to receive polarized light from the ferroelectric liquid crystal so as to process the received light into a projectable visual image.

9. A liquid crystal electrooptic memory device as set forth in claim 6, wherein the memory device further comprises a converting means adapted to convert polarized light from the polarizing plate into electric signals so as to process the electric signals into a projectable visual image.

10. A liquid crystal electrooptic memory device as set forth in claim 6, wherein the memory device further comprises an electric converting-recording means adapted to convert polarized light from the polarizing plate into electric signals and to record the electric signals on a recording medium, so as to produce a projectable visual image based on the recorded signals.

11. A liquid crystal electrooptic memory device as set forth in claim 1, wherein the molecular oriented film is selected from the group consisting of Langmuir-Blodgett oriented polyimide films and oriented polyimide films containing a charge-moving complex.

* * * * *